United States Patent
Suzuki et al.

(10) Patent No.: US 10,673,106 B2
(45) Date of Patent: Jun. 2, 2020

(54) BATTERY PACK AND ELECTRIC WORKING MACHINE

(71) Applicants: MAKITA CORPORATION, Anjo-shi, Aichi (JP); OKITSUMO INCORPORATED, Nabari-shi, Mie (JP)

(72) Inventors: Hitoshi Suzuki, Anjo (JP); Takashi Toyonaga, Nabari (JP); Naoshi Kimura, Nabari (JP)

(73) Assignees: MAKITA CORPORATION, Anjo-shi (JP); OKITSUMO INCORPORATED, Mie (JP)

( * ) Notice: Subject to any disclaimer, the term of this patent is extended or adjusted under 35 U.S.C. 154(b) by 208 days.

(21) Appl. No.: 15/724,660

(22) Filed: Oct. 4, 2017

(65) Prior Publication Data

US 2018/0102575 A1 Apr. 12, 2018

(30) Foreign Application Priority Data

Oct. 7, 2016 (JP) .................................. 2016-199188

(51) Int. Cl.
*H01M 10/6235* (2014.01)
*H01M 2/10* (2006.01)
(Continued)

(52) U.S. Cl.
CPC ...... *H01M 10/6235* (2015.04); *H01L 23/373* (2013.01); *H01M 2/1022* (2013.01);
(Continued)

(58) Field of Classification Search
None
See application file for complete search history.

(56) References Cited

U.S. PATENT DOCUMENTS 6,537,694 B1 * 3/2003 Sugiura ............... H01M 2/1022
429/120
8,330,416 B2 12/2012 Goma
(Continued)

FOREIGN PATENT DOCUMENTS

CN 101500398 A 8/2009
CN 101589503 A 11/2009
(Continued)

OTHER PUBLICATIONS

Dec. 8, 2017 Search Report issued in European Patent Application No. 17195046.2.
(Continued)

*Primary Examiner* — Karie O'Neill Apicella
(74) *Attorney, Agent, or Firm* — Oliff PLC (57) ABSTRACT

A device of the present disclosure includes an electronic component, a metal plate, a housing, and a wavelength selective heat radiating member. The metal plate is thermally coupled to the electronic component. The housing houses the electronic component and the metal plate. The wavelength selective heat radiating member is mounted on a surface of the metal plate, so as to face an inner side surface of a specific portion of the housing. The wavelength selective heat radiating member is configured to convert thermal energy from the electronic component into heat radiation having a wavelength that penetrates the specific portion of the housing, and emit the heat radiation toward the inner side surface of the specific portion of the housing.

17 Claims, 4 Drawing Sheets

(51) Int. Cl.
    *H01M 10/613*     (2014.01)
    *H05K 7/20*     (2006.01)
    *H01M 10/6554*     (2014.01)
    *H01L 23/373*     (2006.01)
    *H01M 10/6551*     (2014.01)
    *H01M 10/46*     (2006.01)
    *H01M 10/42*     (2006.01)
    *H02K 11/33*     (2016.01)

(52) U.S. Cl.
    CPC ....... *H01M 10/4257* (2013.01); *H01M 10/46* (2013.01); *H01M 10/613* (2015.04); *H01M 10/6551* (2015.04); *H01M 10/6554* (2015.04); *H05K 7/209* (2013.01); *H05K 7/20436* (2013.01); *H01M 2220/30* (2013.01); *H02K 11/33* (2016.01)

(56) References Cited

U.S. PATENT DOCUMENTS

| | | |
|---|---|---|
| 9,520,335 B2 | 12/2016 | Masuda et al. |
| 2004/0257038 A1 | 12/2004 | Johnson et al. |
| 2004/0263119 A1 | 12/2004 | Meyer et al. |
| 2005/0007068 A1 | 1/2005 | Johnson et al. |
| 2006/0071634 A1 | 4/2006 | Meyer et al. |
| 2006/0091858 A1 | 5/2006 | Johnson et al. |
| 2006/0103357 A1 | 5/2006 | Johnson et al. |
| 2006/0108975 A1 | 5/2006 | Meyer et al. |
| 2006/0108983 A1 | 5/2006 | Meyer et al. |
| 2006/0108984 A1 | 5/2006 | Johnson et al. |
| 2006/0117580 A1 | 6/2006 | Serdynski et al. |
| 2006/0164032 A1 | 7/2006 | Johnson et al. |
| 2007/0103109 A1 | 5/2007 | Meyer et al. |
| 2007/0103116 A1 | 5/2007 | Johnson et al. |
| 2007/0103121 A1 | 5/2007 | Johnson et al. |
| 2007/0108942 A1 | 5/2007 | Johnson et al. |
| 2007/0273334 A1 | 11/2007 | Meyer et al. |
| 2008/0012530 A1 | 1/2008 | Johnson et al. |
| 2008/0158817 A1 | 7/2008 | Tsunoda et al. |
| 2008/0185993 A1 | 8/2008 | Johnson et al. |
| 2009/0087729 A1 | 4/2009 | Johnson et al. |
| 2009/0153101 A1 | 6/2009 | Meyer et al. |
| 2009/0160452 A1 | 6/2009 | Meyer |
| 2009/0195216 A1 | 8/2009 | Johnson et al. |
| 2009/0197152 A1 | 8/2009 | Johnson et al. |
| 2009/0284230 A1 | 11/2009 | Goma |
| 2010/0097768 A1 | 4/2010 | Ishii et al. |
| 2010/0148729 A1 | 6/2010 | Johnson et al. |
| 2010/0167110 A1 | 7/2010 | Johnson et al. |
| 2010/0236807 A1 | 9/2010 | Johnson et al. |
| 2010/0302735 A1 | 12/2010 | Ishii et al. |
| 2010/0327815 A1 | 12/2010 | Johnson et al. |
| 2011/0114350 A1 | 5/2011 | Johnson et al. |
| 2011/0122574 A1 | 5/2011 | Tsunoda et al. |
| 2011/0128706 A1 | 6/2011 | Tsunoda et al. |
| 2011/0214896 A1 | 9/2011 | Johnson et al. |
| 2011/0215767 A1 | 9/2011 | Johnson et al. |
| 2011/0297411 A1 | 12/2011 | Johnson et al. |
| 2012/0001596 A1 | 1/2012 | Meyer et al. |
| 2012/0194136 A1 | 8/2012 | Johnson et al. |
| 2012/0301764 A1 | 11/2012 | Johnson et al. |
| 2013/0224527 A1 | 8/2013 | Johnson et al. |
| 2013/0224528 A1 | 8/2013 | Johnson et al. |
| 2013/0241499 A1 | 9/2013 | Johnson et al. |
| 2013/0244070 A1 | 9/2013 | Johnson et al. |
| 2013/0277033 A1 | 10/2013 | Wu |
| 2013/0335012 A1 | 12/2013 | Meyer et al. |
| 2014/0041887 A1 | 2/2014 | Johnson et al. |
| 2014/0091771 A1 | 4/2014 | Johnson et al. |
| 2014/0159507 A1 | 6/2014 | Johnson et al. |
| 2014/0248519 A1* | 9/2014 | Nishikawa ............ H01M 2/105 429/99 |
| 2014/0321056 A1 | 10/2014 | Yoshikawa et al. |
| 2015/0263544 A1 | 9/2015 | Johnson et al. |
| 2015/0288038 A1 | 10/2015 | Johnson et al. |
| 2015/0318581 A1 | 11/2015 | Johnson et al. |
| 2015/0340887 A1 | 11/2015 | Meyer et al. |
| 2016/0226290 A1 | 8/2016 | Johnson et al. |
| 2016/0260649 A1* | 9/2016 | Masuda ................ C23C 14/042 |
| 2016/0301113 A1 | 10/2016 | Johnson et al. |
| 2016/0308380 A1 | 10/2016 | Johnson et al. |
| 2017/0256815 A1 | 9/2017 | Johnson et al. |
| 2017/0271899 A1 | 9/2017 | Johnson et al. |
| 2017/0279290 A1 | 9/2017 | Johnson et al. |

FOREIGN PATENT DOCUMENTS

| | | |
|---|---|---|
| CN | 201824332 U | 5/2011 |
| CN | 202310428 U | 7/2012 |
| CN | 202603124 U | 12/2012 |
| CN | 103959926 A | 7/2014 |
| EP | 1274137 A1 | 1/2003 |
| JP | 2010-027831 A | 2/2010 |
| JP | 4547036 B2 | 9/2010 |
| TW | 201611210 A | 3/2016 |
| WO | 2007/029311 A1 | 3/2007 |

OTHER PUBLICATIONS

Feb. 3, 2020 Office Action issued in Chinese Patent Application No. 201710940551.X.

* cited by examiner

BATTERY PACK AND ELECTRIC WORKING MACHINE

CROSS-REFERENCE TO RELATED APPLICATIONS

This application claims the benefit of Japanese Patent Application No. 2016-199188 filed in Japanese Patent Office on Oct. 7, 2016, the disclosure of which is incorporated herein by reference.

BACKGROUND

The present disclosure relates to a battery pack and an electric working machine, and to the corresponding devices. Japanese Patent Publication No. 4547036 discloses a battery pack that is attached to an electric power tool. The battery pack includes therein an FET (i.e., field-effect transistor), and a heat sink.

SUMMARY

However, in the above-described battery pack, heat from the FET is discharged to the inside of the battery pack through the heat sink. Therefore, heat from the FET will stay in the battery pack, and the heat sink cannot effectively lower the temperature of the FET. It is also possible that poor dissipation of heat increases the temperature in the battery pack. This temperature rise may adversely affect components other than the FET (e.g., other electronic components, battery cells, etc.) in the battery pack. Further, such disadvantages resulting from the poor dissipation of heat can also occur in an electric working machine as well.

In the present disclosure, for example, it is desirable to efficiently release heat from a built-in electronic component to the outside of a housing of a device such as a battery pack, an electric working machine or the like.

A device according to one aspect of the present disclosure includes an electronic component, a metal plate, a housing, and a wavelength selective heat radiating member. The metal plate is thermally coupled to the electronic component. The housing is configured to house the electronic component and the metal plate.

The wavelength selective heat radiating member is mounted on a surface of the metal plate, so as to face an inner side surface of a specific portion of the housing. The wavelength selective heat radiating member is configured to convert thermal energy from the electronic component into heat radiation having a wavelength that penetrates the specific portion of the housing, and emit the heat radiation toward the inner side surface of the specific portion of the housing.

In such a device, the thermal energy from the electronic component is transmitted to the wavelength selective heat radiating member via the metal plate. The thermal energy is converted into heat radiation having a wavelength that can penetrate the specific portion of the housing by the wavelength selective heat radiating member, and emitted toward the inner side surface of the specific portion of the housing. Thus, the thermal energy from the electronic component penetrates the specific portion of the housing in the form of heat radiation, and is released to the outside of the housing.

Therefore, the heat from the electronic component built in the device can be efficiently discharged to the outside of the housing. Heat from the electronic component is removed from the housing, which improves effect of lowering the temperature of the electronic component. Furthermore, since the temperature rise in the housing is reduced, the possibility that the temperature rise affects other components in the housing is also reduced.

A thickness of the specific portion of the housing may be smaller than a thickness of a periphery of the specific portion in the housing. Small thickness improves heat dissipation from the specific portion of the housing. This is because, the smaller the thickness of the specific portion is, the more easily the heat radiation can penetrate the specific portion.

The device may include a wall portion configured to inhibit air of a periphery of the wavelength selective heat radiating member from moving. The wall portion can inhibit the temperature of the wavelength selective heat radiating member from being lowered due to convection in the device. Therefore, it is possible to inhibit a decrease in conversion efficiency of thermal energy into heat radiation by the wavelength selective heat radiating member. The heat dissipation from the specific portion of the housing can be enhanced.

According to one aspect of the present disclosure, a battery pack for an electric working machine may include an electronic component, a metal plate, a housing, and a selective heat radiating member.

In this battery pack, the metal plate is thermally coupled to the electronic component. The housing is configured to house the electronic component and the metal plate. The wavelength selective heat radiating member is mounted on a surface of the metal plate, so as to face an inner side surface of a specific portion of the housing. The wavelength selective heat radiating member is configured to convert thermal energy from the electronic component to heat radiation having a wavelength that penetrates the specific portion of the housing, and emit the heat radiation toward the inner side surface of the specific portion.

According to one aspect of the present disclosure, the housing of the battery pack may include an attachment portion for attachment to the electric working machine. An outer side surface of the specific portion of the housing may be a non-attachment portion of an outer side surface of the housing. According to this battery pack, effect of releasing thermal energy to the outside from the housing (i.e., heat dissipation effect) can be enhanced. This is because the release of thermal energy from the housing is not blocked by the main body of the electric working machine.

According to one aspect of the present disclosure, an electric working machine may be provided that includes an electronic component, a metal plate, a housing, and a selective heat radiating member.

In the electric working machine, the metal plate is thermally coupled to the electronic component. The housing is configured to house the electronic component and the metal plate. The wavelength selective heat radiating member is mounted on a surface of the metal plate, so as to face an inner side surface of a specific portion of the housing. The wavelength selective heat radiating member is configured to convert thermal energy from the electronic component into heat radiation having a wavelength that penetrates the specific portion of the housing, and emit the heat radiation toward the inner side surface of the specific portion.

In such an electric working machine, thermal energy from the electronic component is transmitted to the wavelength selective heat radiating member via the metal plate. The thermal energy is converted into heat radiation having a wavelength that can penetrate the housing by the wavelength selective heat radiating member, and is emitted toward the inner side of the specific portion of the housing. Therefore, the thermal energy from the electronic component penetrates the specific portion of the housing in the form of heat radiation, and is released to the outside of the housing.

Therefore, the heat from the electronic component built in the housing of the electric working machine can be efficiently released to the outside. In other words, heat from the electronic component is inhibited from staying in the electric working machine, and the effect of lowering the temperature of the electronic component is improved. Furthermore, since a temperature rise in the electric working machine can be reduced, the possibility that the temperature rise affects other components than the electronic component in the housing is also reduced.

In the battery pack and/or the electric working machine, a thickness of the specific portion of the housing may be smaller than a thickness of a periphery of the specific portion in the housing. According to the thus constructed battery pack and/or the electric working machine, effect of heat dissipation from the specific portion of the housing is improved. This is because the smaller the thickness of the specific portion is, i.e., the thinner the specific portion is, the more easily the heat radiation penetrates that specific portion.

The battery pack and/or the electric working machine may include a wall portion configured to inhibit air near a periphery of the wavelength selective heat radiating member from moving. According to the thus constructed battery pack and/or the electric working machine, the temperature of the wavelength selective heat radiating member is inhibited from being lowered due to convection in the housing. Therefore, it is possible to inhibit a decrease in conversion efficiency of thermal energy into heat radiation by the wavelength selective heat radiating member. The heat dissipation from the specific portion of the housing can be enhanced.

The housing of the electric working machine may include a portion to which the battery pack is attached. The electric working machine may be configured so that electric power is supplied from the battery pack. In this case, an outer side surface of the specific portion of the housing may be a portion of an outer side surface of the housing different from the portion where the battery pack is attached. According to the electric working machine configured as described above, the effect of releasing thermal energy from the specific portion of the housing to the outside can be enhanced. This is because the release of thermal energy from the housing is not blocked by the battery pack.

BRIEF DESCRIPTION OF THE DRAWINGS

An example embodiment of the present disclosure will be described hereinafter by way of example with reference to the accompanying drawings, in which.

DETAILED DESCRIPTION OF THE PREFERRED EMBODIMENTS

1. Overall Configuration of Grinder

Figure 1:
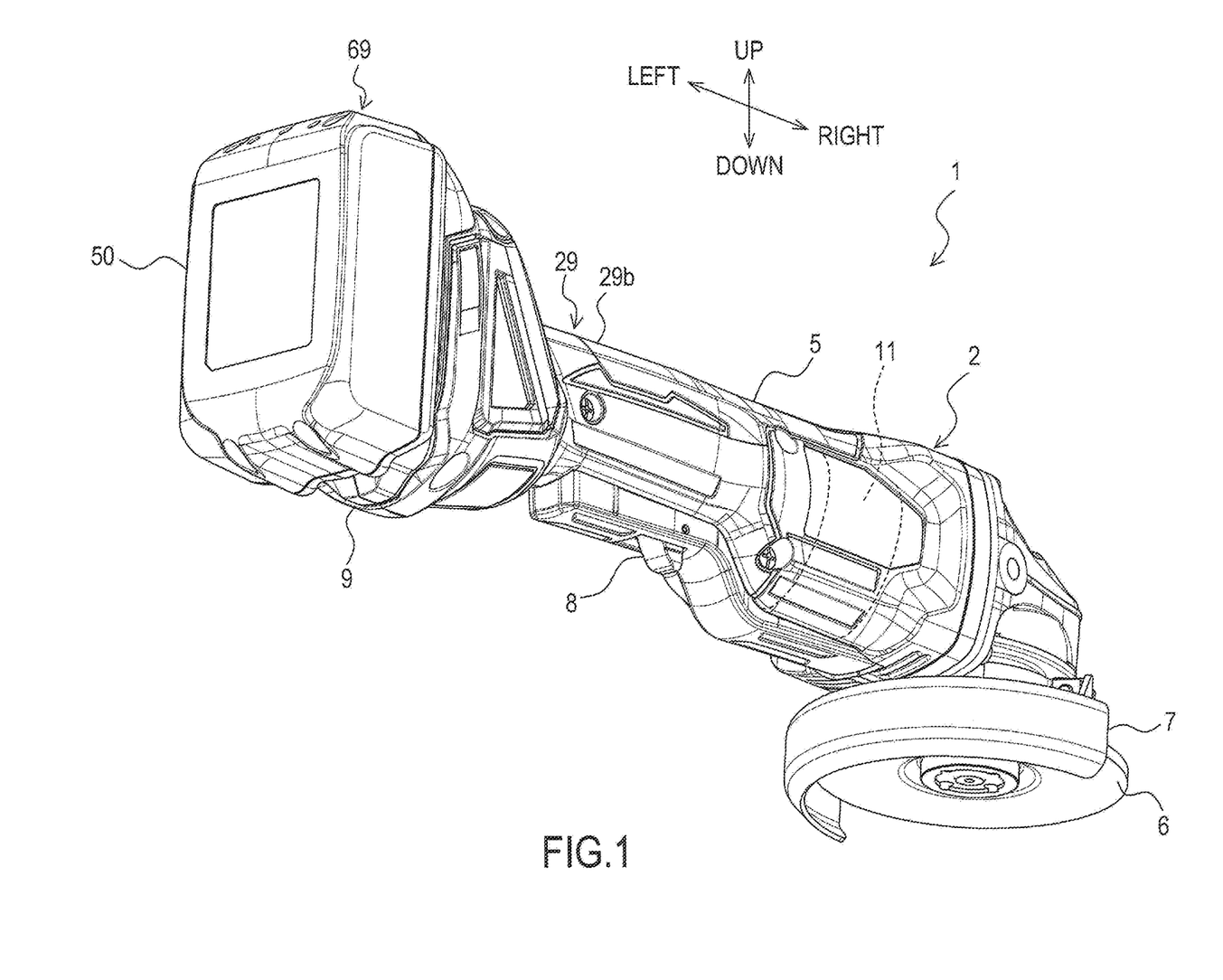
FIG. 1 is a perspective view of a grinder in a state where a battery pack is attached.
Figure 2:
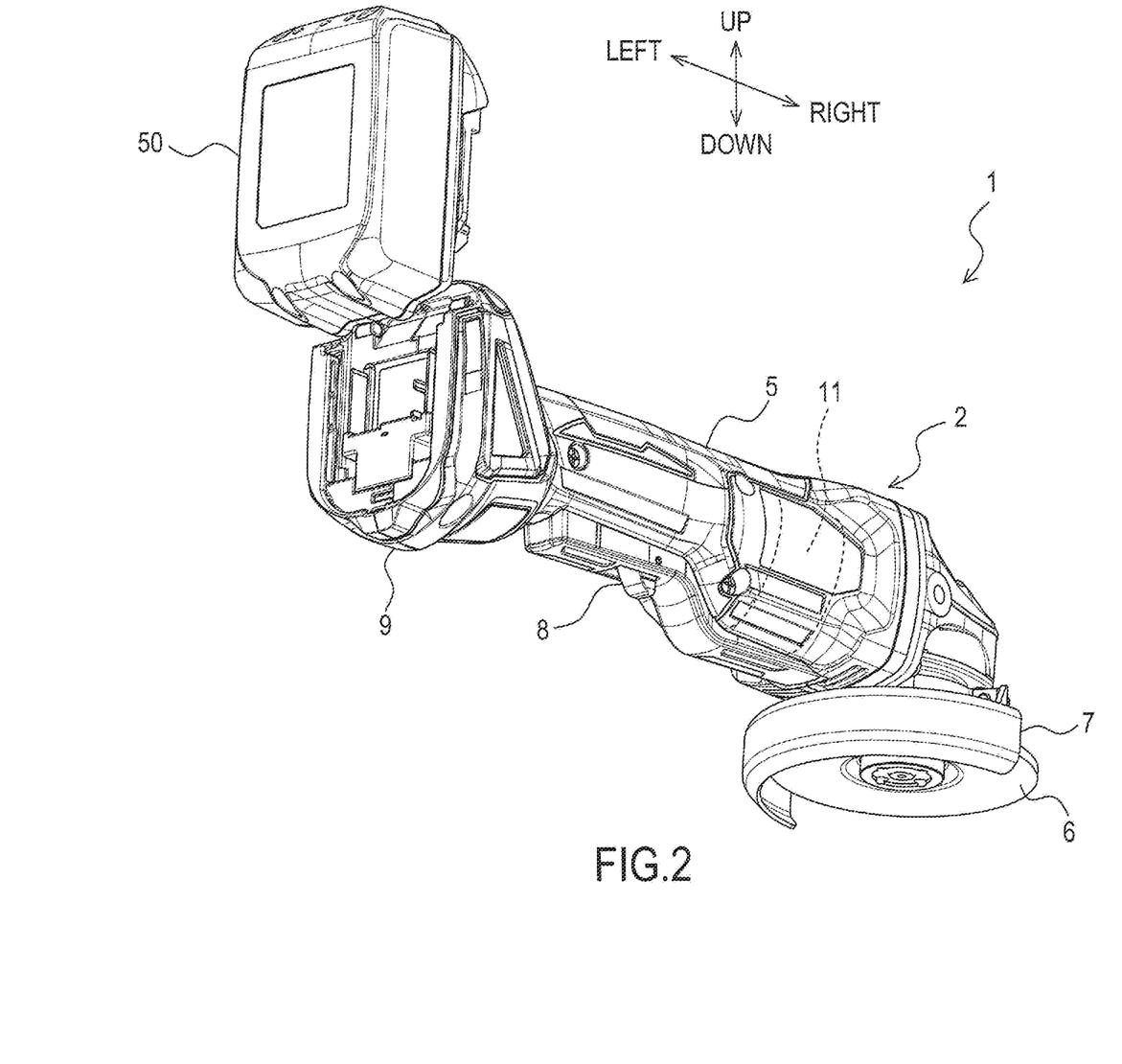
FIG. 2 is a perspective view of the grinder in a state where the battery pack is removed.

As an example of an electric working machine, FIGS. 1 and 2 show a grinder 1 of the present embodiment. The grinder 1 is an electric working machine that can perform processing such as grinding, polishing, cutting, etc. on a workpiece.

As shown in FIGS. 1 and 2, the grinder 1 includes a main body 2 and a battery pack 50. The main body 2 includes a main housing 5, a tool bit 6, a cover 7, and an operation switch 8.

Figure 3:
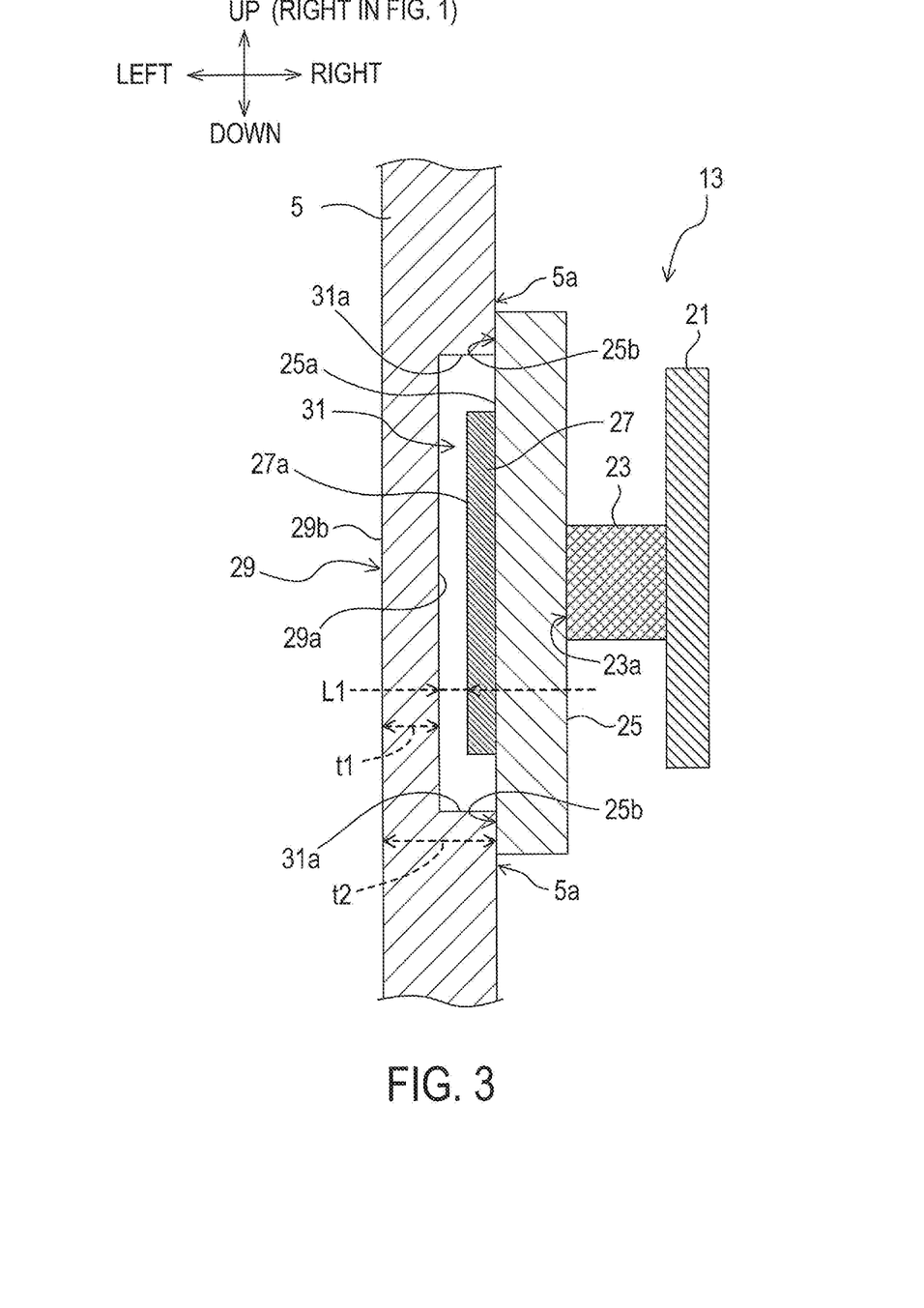
FIG. 3 is a schematic diagram for illustrating a heat dissipation structure of a housing of the grinder.

The main housing 5, which is a housing of the main body 2, is made of resin, and at least partially forms an outer side surface of the main body 2. Inside the main housing 5, a motor 11 and a controller 13 shown in FIG. 3 are housed.

The motor 11 is a power source of the grinder 1. The motor 11 is disposed at a front end of the main housing 5 (i.e., right side in FIG. 1). The motor 11 is an electric motor, and may be, but not limited to, a brushless motor, for example.

The controller 13 (see FIG. 3) is configured to mainly control the motor 11. The controller 13 is disposed, for example, at a rear end of the main housing 5 (i.e. left side in FIG. 1).

The rear end of the main housing 5 is provided with a battery attachment portion 9 for attaching the battery pack 50 to the main body 2. The battery pack 50 is configured to be attachable to and detachable from the battery attachment portion 9.

Figure 4:
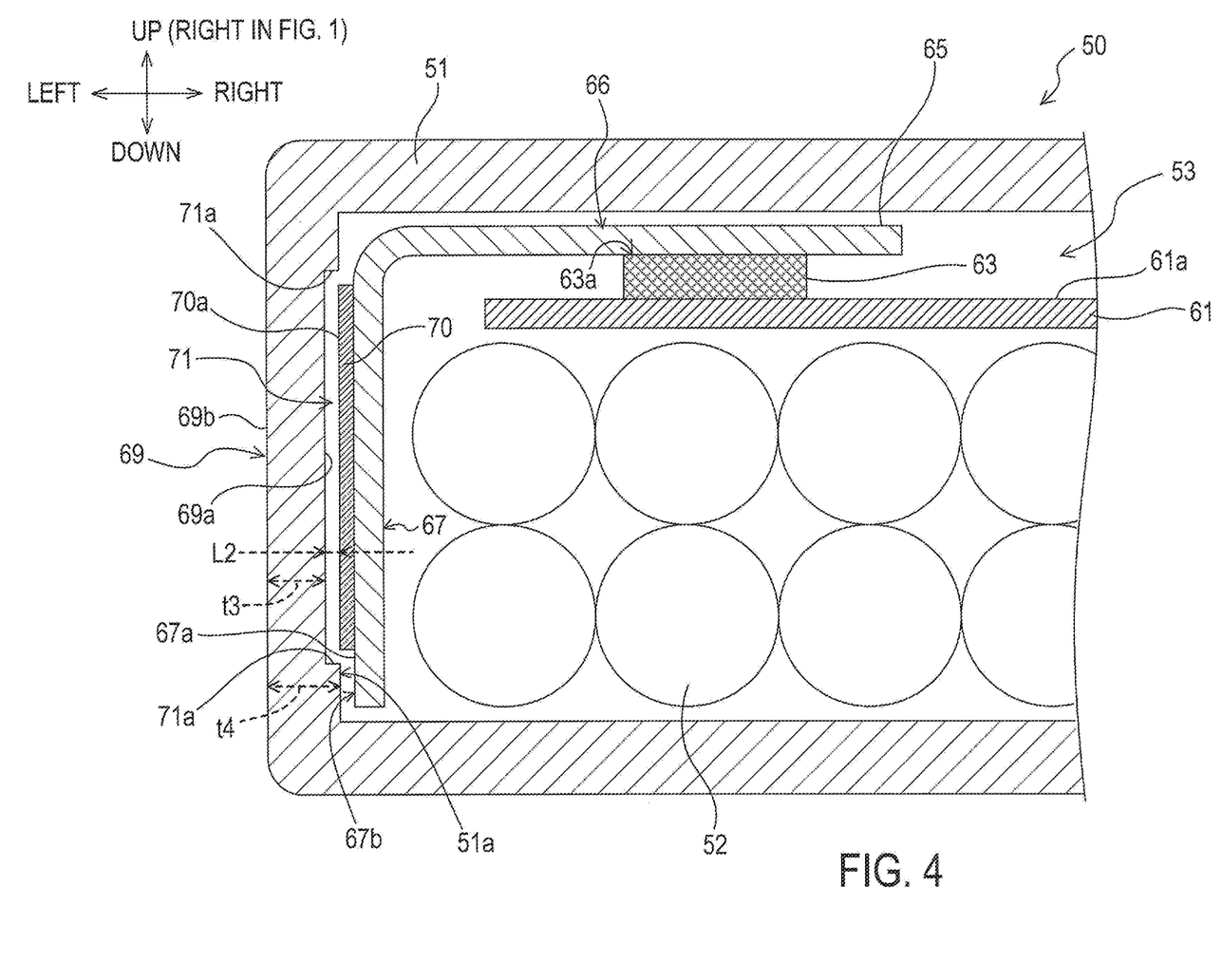
FIG. 4 is a schematic diagram for illustrating a heat dissipation structure of the battery pack.

As shown in FIG. 4, the battery pack 50 houses a plurality of batteries 52. Specifically, the plurality of batteries 52 are housed in a battery housing 51, which is a housing of the battery pack 50. Each of circles shown in FIG. 4 corresponds to one of the batteries 52. Each of the batteries 52 is called a battery cell or simply a cell.

Electric power from the batteries 52 can be provided to the main body 2 when the battery pack 50 is attached to the main body 2, as shown in FIG. 1. Each electric load such as the motor 11, the controller 13, or the like in the main body 2 is configured to operate by the electric power supplied from the batteries 52.

The tool bit 6 is a member for machining a workpiece by being in contact with the workpiece. The tool bit 6 is rotated and driven by the motor 11. Examples of the tool bit 6 include a grinding wheel, a cutting grindstone, a wire brush and the like.

The cover 7 is used to protect a user from scattering of broken pieces of the workpiece and the tool bit 6 caused during processing of the workpiece by the tool bit 6. The cover 7 is formed in a substantially semicircular shape, so as to cover a part of an outer periphery of the tool bit 6.

The operation switch 8 is a switch for rotating the tool bit 6. When the user presses the operating switch 8, the motor 11 is driven. Thereby, the tool bit 6 is rotated and driven.

The controller 13 operates by electric power of the batteries 52 to control driving of the motor 11. When the operation switch 8 is pressed by the user, the controller 13 supplies the electric power to the motor 11 to rotate the motor 11.

2. Heat Dissipation Structure of Housing

As shown in FIG. 3, the controller 13 includes a printed circuit board (hereinafter referred to as PCB) 21 and an electronic component 23 mounted on the PCB 21.

Heat is generated from the electronic component 23. Therefore, measures to dissipate heat from the electronic component 23 are necessary. The electronic component 23 includes, for example, an electronic component related to driving of the motor 11. The electronic component 23 includes, for example, a switching element constituting an inverter that supplies electric power to the motor 11. The switching element is, for example, a power MOSFET. The switching element may be other types of transistors. The electronic component 23 may be an electronic component other than the switching element, with heat generation.

A metal plate 25 serving as a heat sink is mounted on a surface 23a of the electronic component 23 opposite to the PCB 21. The metal plate 25 is thermally coupled to the electronic component 23. Specifically, the PCB 21 and the metal plate 25 are disposed so that the surface 23a of the electronic component 23 and a surface of the metal plate 25 are in contact with each other. Therefore, heat generated in the electronic component 23 is transmitted to the metal plate 25. Material of the metal plate 25 is, for example, aluminum, but may be a metal such as iron or copper. Between the electronic component 23 and the metal plate 25, an additional member (not shown) such as an elastic material having thermal conductivity may be provided.

A sheet-like wavelength selective heat radiating member 27 is mounted on a surface 25a of the metal plate 25 opposite to the electronic component 23. The heat radiating member 27 is mounted on the surface 25a of the metal plate 25, for example, by an adhesive having high thermal conductivity. Thus, thermal energy from the electronic component 23 is transmitted to the heat radiating member 27 through the metal plate 25.

The heat radiating member 27 converts the thermal energy from the electronic component 23 transmitted to the heat radiating member 27 into heat radiation having a wavelength that can penetrate the main housing 5 and emits the heat radiation from a surface 27a opposite to the metal plate 25. The heat radiating member 27 is, for example, an aluminum sheet on which a large number of micro-cavities which are two-dimensionally arranged are formed. Such a heat radiating member 27 is also called a metamaterial. In the present embodiment, the heat radiation having a wavelength that can penetrate the main housing 5 is a heat radiation in the infrared wavelength range (i.e., infrared light), but may be a heat radiation in another wavelength range. Examples of such heat radiating member 27 is disclosed in Japanese Unexamined Patent Application Publication No. 2014-33062.

The surface 27a of the heat radiating member 27 is arranged so as to face an inner side surface 29a of a specific portion 29 of the main housing 5. Thus, the heat radiating member 27 is mounted on the surface 25a of the metal plate 25 so as to face the inner side surface 29a of the specific portion 29 of the main housing 5.

An outer side surface 29b of the specific portion 29 of the main housing 5 is a portion (a non-attachment portion) of an outer side surface of the main housing 5 that is different from a portion (an attachment portion) where the battery pack 50 is attached or may be attached. For example, the upper side in FIG. 3 corresponds to the right side in FIG. 1. As shown in FIG. 1, the specific portion 29 of the main housing 5 is, for example, an upper portion near the rear end of the main housing 5. The upper side in FIG. 1 is the upper side when the grinder 1 is horizontally used.

A thickness t1 of the specific portion 29 as shown in FIG. 3 is smaller than a thickness t2 of the other portion in the main housing 5 including a periphery of the specific portion 29. Specifically, a recess 31 that can house the heat radiating member 27 is formed inside the specific portion 29 of the main housing 5. A concave surface of the recess 31 corresponds to the inner side surface 29a facing the heat radiating member 27.

The metal plate 25 is disposed so as to be brought into contact with an inner side surface 5a of a periphery of the recess 31 in the main housing 5. Therefore, the metal plate 25 is disposed so that the main housing 5 is brought into contact with the portion 25b of the surface 25a of the metal plate 25 of a periphery of the heat radiating member 27. For this reason, the heat radiating member 27 is brought into a substantially sealed state in the recess 31. That is, a wall portion 31a of the recess 31 perpendicular to the surface 25a of the metal plate 25 functions to hinder air of the periphery of the heat radiating member 27 from moving. There may be a slight gap between the portion 25b of the surface 25a of the metal plate 25 and the inner side surface 5a of the periphery of the recess 31 in the main housing 5.

A distance L1 between the heat radiating member 27 and the inner side surface 29a is configured to be as small as possible. For example, the distance L1 corresponds to a tolerance range required for assembling, which is 0.5 mm or less.

3. Effect of Heat Dissipation Structure of Housing

According to the heat dissipation structure of the main housing 5 as described above, the following effects are achieved.

(3a) The thermal energy from the electronic component 23 is transmitted to the heat radiating member 27 via the metal plate 25. The thermal energy is converted into heat radiation having a wavelength that can penetrate the main housing 5 by the heat radiating member 27 and is emitted toward the inner side surface 29a of the specific portion 29 of the main housing 5. Therefore, the thermal energy from the electronic component 23 penetrates the specific portion 29 of the main housing 5 in the form of heat radiation, and is released to the outside of the main housing 5.

Therefore, the heat from the electronic component 23 built in the main housing 5 can be efficiently released to the outside of the main housing 5. Therefore, the heat from the electronic component 23 is removed from the grinder 1. Accordingly, effect of lowering the temperature of the electronic component 23 can be improved. Furthermore, temperature rise in the grinder 1 is inhibited. Therefore, the possibility that the temperature rise affects other components than the electronic component 23 is also reduced.

(3b) The thickness t1 of the specific portion 29 of the main housing 5 is smaller than the thickness t2 of the portion other than the specific portion 29 of the main housing 5. Therefore, effect of releasing the thermal energy from the specific portion 29 of the main housing 5 to the outside (i.e., heat dissipation effect) can be enhanced. This is because the smaller the thickness t1 of the specific portion 29 is, the more easily the heat radiation penetrates the specific portion 29.

(3c) The wall portion 31a of the main housing 5 hinders the air of the periphery of the heat radiating member 27 from moving. Therefore, the temperature of the heat radiating member 27 can be inhibited from being lowered due to convection in the grinder 1 (i.e., in the main housing 5). As a result, it is possible to inhibit a decrease in conversion efficiency of thermal energy into heat radiation by the heat radiating member 27. High conversion efficiency improves the heat dissipation from the specific portion 29 of the main housing 5.

(3d) The outer side surface 29b of the specific portion 29 of the main housing 5 is a portion (a non-attachment portion) of the outer side surface of the main housing 5 that is different from the portion (the attachment portion) where the battery pack 50 is attached or may be attached. Therefore, release of thermal energy from the main housing 5 is not blocked by the battery pack 50. Such a heat dissipation structure can enhance the heat dissipation from the specific portion 29 of the main housing 5. In the main housing 5, the specific portion 29 facing the heat radiating member 27 is not limited to the portion of the wall of the main housing 5 indicated by a reference numeral "29" in FIG. 1.

(3e) The distance L1 between the heat radiating member 27 and the specific portion 29 of the main housing 5 is made as small as possible. The small distance L1 improves the heat dissipation from the specific portion 29.

4. Heat Dissipation Structure of Battery Pack

As shown in FIG. 4, in the battery housing 51, the above-described plurality of batteries 52 are housed. Furthermore, a monitoring control circuit 53 is also housed in the battery housing 51. The battery housing 51 is made of resin. The battery housing 51 at least partially forms an outer side surface of the battery pack 50.

In FIG. 4, an upper surface of the battery housing 51 is a surface facing the main body 2 when the battery housing 51 is attached to the main body 2 of the grinder 1. Therefore, the upper side in FIG. 4 corresponds to the right side in FIG. 1. The left side in FIG. 4 corresponds to the upper side in FIG. 1, for example. Terms "up", "down", "left", and "right" used in the description related to the battery pack 50 below correspond to directions shown in FIG. 4.

The monitoring control circuit 53 operates by electric power of the batteries 52. The monitoring control circuit 53 is configured, for example, to monitor electric current into and out of the batteries 52 (i.e., charging and discharging current), and/or a voltage of the batteries 52. The monitoring control circuit 53, when abnormality occurs in the electric current and/or voltage to be monitored, notifies the controller 13 of the grinder 1 of the occurrence of abnormality, and/or, disconnects a charge and discharge path of the batteries 52. The monitoring control circuit 53 includes a PCB 61, and an electronic component 63 mounted on the PCB 61.

The electronic component 63 may include, for example, an electronic component associated with power supply. The electronic component 63, for example, includes a switching element provided in the charge and discharge path of the batteries 52 to switch between connection and disconnection of the charge and discharge path. The switching element is, for example, a power MOSFET. However, the switching element may be other types of transistors. The electronic component 63 may be an electronic component other than the switching element. The electronic component 63, for example, may be a current detection resistor provided in the charge and discharge path of the batteries 52. Heat is generated from the electronic component 63.

As shown in FIG. 4, the PCB 61 of the monitoring control circuit 53 is provided on an upper side of the batteries 52 in the battery housing 51. The electronic component 63 is mounted on an upper surface of the PCB 61, namely, a surface 61a of the PCB 61 opposite to the batteries 52.

A metal plate 65 serving as a heat sink is mounted on the surface 63a of the electronic component 63 opposite to the PCB 61. Specifically, in the battery housing 51, the PCB 61 and the metal plate 65 are fixed so that the surface 63a of the electronic component 63 and a surface of the metal plate 65 are brought into contact with each other. Therefore, the metal plate 65 is thermally coupled to the electronic component 63. Thus, heat generated in the electronic component 63 is transmitted to the metal plate 65. Material of the metal plate 65 is, for example, aluminum, but may be a metal such as iron or copper. Between the electronic component 63 and the metal plate 65, an additional member (not shown) such as an elastic material having thermal conductivity may be provided.

The metal plate 65 is formed by bending a flat metal plate at a substantially right angle. The metal plate 65 includes a first flat plate portion 66, and a second flat plate portion 67. The first flat plate portion 66 is a flat plate-shaped portion of the metal plate 65 which extends in parallel to the PCB 61. The first flat plate portion 66 is in contact with the electronic component 63. The second flat plate portion 67 is a plate-like portion of the metal plate 65 which extends downward from a left end of the first flat plate portion 66. The second flat plate portion 67 is disposed substantially parallel to a specific portion 69 which is a part of a left side wall of the battery housing 51.

In other words, in the battery housing 51, the metal plate 65 is fixed to the PCB 61 through the electronic component 63 so that the first flat plate portion 66 of the metal plate 65 contacts the electronic component 63 and the second flat plate portion 67 of the metal plate 65 is substantially parallel to the specific portion 69 of the battery housing 51.

A heat radiating member 70 similar to the heat radiating member 27 is attached to a surface 67a of the second flat plate portion 67 on the side of the specific portion 69, i.e., a surface facing an inner side surface 69a of the specific portion 69. In other words, in the battery pack 50, the heat radiating member 70 is mounted on the surface 67a of the metal plate 65 so as to face the inner side surface 69a of the specific portion 69 in the battery housing 51.

Thermal energy from the electronic component 63 is transmitted to the heat radiating member 70 via the metal plate 65. The heat radiating member 70 converts the thermal energy transmitted from the electronic component 63 via the metal plate 65 into heat radiation having a wavelength that can penetrate the battery housing 51 and emits the heat radiation toward the inner side surface 69a of the specific portion 69 in the battery housing 51. The heat radiation is a heat radiation in the infrared wavelength range (i.e., infrared light), but may be a heat radiation in another wavelength range. The heat radiating member 70 may be mounted on the surface 67a of the metal plate 65, for example, by an adhesive having high thermal conductivity.

An outer side surface 69b of the specific portion 69 of the battery housing 51 is a portion of an outer side surface of the battery housing 51 different from the portion attached to the main body 2 of the grinder 1.

Further, a thickness t3 of the specific portion 69 that faces the heat radiating member 70 in the battery housing 51 is smaller than a thickness t4 of the other portion including a periphery of the specific portion 69 of the battery housing 51.

Specifically, in the battery housing 51, a recess 71 having an area larger than the heat radiating member 70 is formed inside the specific portion 69. A concave surface of the recess 71 is the inner side surface 69a facing the heat radiating member 70.

Further, a surface 70a of the heat radiating member 70 facing the specific portion 69 is on the same plane as the inner side surface 51a of a periphery of the recess 71 of the battery housing 51. In other words, this is a substantially "co-planar arrangement."

Therefore, a wall portion 71a of the recess 71 perpendicular to the surface 67a of the second flat plate portion 67 of the metal plate 65 functions to hinder air of a periphery of the heat radiating member 70 from moving. However, the surface 70*a* of the heat radiating member 70 may not be on the same plane as the inner side surface 51*a* of the battery housing 51. In other words, a part in the thickness direction of the heat radiating member 70 may enter the recess 71, creating a "penetrating arrangement." A portion 67*b* of the surface 67*a* of the second flat plate portion 67 of the periphery of the heat radiating member 70 may be in contact with the inner side surface 51*a* of the battery housing 51, creating a "peripheral contact arrangement."

The heat radiating member 70 and the inner side surface 69*a* are configured so that a distance L2 between the heat radiating member 70 and the inner side surface 69*a* is as small as possible. For example, the distance L2 is a tolerance range required for assembling, which is specifically 1 mm or less.

5. Effect by Heat Dissipation Structure of Battery Pack

According to the heat dissipation structure of the battery pack 50 as described above, the following effects are achieved.

(5a) The thermal energy from the electronic component 63 is transmitted to the heat radiating member 70 through the metal plate 65. The thermal energy is converted to heat radiation having a wavelength that can penetrate the battery housing 51 by the heat radiating member 70, and emitted toward the inner side surface 69*a* of the specific portion 69 of the battery housing 51. Therefore, the thermal energy, in the form of heat radiation, penetrates the specific portion 69 of the battery housing 51, and is discharged to the outside of the battery housing 51.

Therefore, the heat from the electronic component 63 built in the battery housing 51 can be efficiently discharged to the outside of the battery housing 51. Thus, the heat from the electronic component 63 is inhibited from staying in the battery pack 50. The effect of lowering the temperature of the electronic component 63 is improved. Furthermore, temperature rise in the battery pack 50 is inhibited. Therefore, the possibility that the temperature rise affects other components than the electronic component 63 is also reduced.

(5b) The thickness t3 of the specific portion 69 of the battery housing 51 is smaller than the thickness t4 of the other portion of the battery housing 51. Therefore, the effect of releasing the thermal energy to the outside from the specific portion 69 of the battery housing 51 (i.e., heat dissipation effect) can be enhanced. This is because the smaller the thickness t3 of the specific portion 69 is, the more easily the heat radiation penetrates the specific portion 69.

(5c) The wall portion 71*a* of the battery housing 51 hinders the air of the periphery of the heat radiating member 70 from moving. Therefore, the temperature of the heat radiating member 70 can be inhibited from being lowered by convection inside the battery pack 50 (i.e., inside the battery housing 51). As a result, it is possible to maintain a high conversion efficiency of thermal energy to heat radiation by the heat radiating member 70. High conversion efficiency improves the heat dissipation from the specific portion 69 of the battery housing 51.

(5d) The outer side surface 69*b* of the specific portion 69 of the battery housing 51 is a portion of the outer side surface of the battery housing 51 different from the portion attached to the main body 2 of the grinder 1. Therefore, release of thermal energy from the battery housing 51 is not blocked by the main body 2. Such a heat dissipation structure can enhance the heat dissipation from the specific portion 69 of the battery housing 51. In the battery housing 51, the specific portion 69 that faces the heat radiating member 70 may be a part of a lower wall or a part of a right wall of the battery housing 51 in FIG. 4.

(5e) The distance L2 between the heat radiating member 70 and the specific portions 69 of the battery housing 51 is made as small as possible. Small distance L2 improves the heat dissipation from the specific portion 69.

6. Other Embodiments

An embodiment of the present disclosure has been described in the above, but the present disclosure is not limited to the above embodiment and can be modified in various ways.

For example, the present disclosure can be applied to various electric working machines such as an electric hammer, an electric hammer drill, an electric drill, an electric driver, an electric wrench, an electric reciprocating saw, an electric jigsaw, an electric cutter, an electric chainsaw, an electric plane, an electric circular saw, an electric nailer including an electric tacker, an electric hedge trimmer, an electric lawn mower, an electric lawn trimmer, electric grass cutter, an electric cleaner, an electric blower and the like.

Further, a plurality of function of a single component in the above embodiment may be implemented by a plurality of components, and one of the function of a single component may be implemented by a plurality of components. Further, a plurality of functions of a plurality of components may be implemented by a single component, and one of the functions implemented by a plurality of components may be implemented by a single component. Also, part of the configuration of the above embodiment may be omitted. Any aspect included in the technical idea specified from the language as set forth in the appended claims is an embodiment of the present disclosure. The present disclosure can also be implemented in various forms such as a heat dissipation method of a battery pack, a heat dissipation method of an electric working machine, or the like.

What is claimed is:
1. A device for electric working machine, the device comprising:
an electronic component;
a metal plate thermally coupled to the electronic component;
a housing configured to house the electronic component and the metal plate; and
a wavelength selective heat radiating member mounted on a surface of the metal plate so as to face an inner side surface of a specific portion of the housing, the wavelength selective heat radiating member including a plurality of micro-cavities and being configured to convert, by the plurality of micro-cavities, thermal energy from the electronic component into heat radiation having a wavelength in an infrared wavelength range that penetrates the specific portion of the housing, and to emit the heat radiation toward the inner side surface of the specific portion of the housing, and
a wall portion configured to surround a periphery of the inner side surface of the specific portion facing the wavelength selective heat radiating member so as to inhibit air at a periphery of the wavelength selective heat radiating member from moving, wherein the wavelength selective heat radiating member is at least partially housed in a space defined by the wall portion.

2. The device according to claim 1, wherein a thickness of the specific portion of the housing is smaller than a thickness of a periphery of the specific portion in the housing.

3. The device according to claim 1, wherein the housing includes a recess facing the wavelength selective heat radiating member at the specific portion, the recess being configured to inhibit air between the specific portion and the wavelength selective heat radiating member from moving, and wherein a thickness of the recess is smaller than a thickness of the periphery of the specific portion in the housing.

4. The device according to claim 1, wherein the metal plate includes a first flat plate portion, and a second flat plate portion extending from the first plate portion, the second flat plate portion having an angle with respect to the first flat plate portion, wherein the electronic component is in contact with the first flat plate portion, and the wavelength selective heat radiating member is in contact with the second flat plate portion.

5. The device according to claim 1, wherein the electronic component includes a field effect transistor.

6. A battery pack for an electric working machine, the battery pack comprising:
an electronic component;
a metal plate thermally coupled to the electronic component;
a housing configured to house the electronic component and the metal plate; and
a wavelength selective heat radiating member mounted on a surface of the metal plate so as to face an inner side surface of a specific portion of the housing, the wavelength selective heat radiating member including a plurality of micro-cavities and being configured to convert, by the plurality of micro-cavities thermal energy from the electronic component into heat radiation having a wavelength that penetrates the specific portion of the housing, and to emit the heat radiation toward the inner side surface of the specific portion of the housing,
a thickness of the specific portion of the housing being smaller than a thickness of a periphery of the specific portion in the housing,
wherein the wavelength selective heat radiating member is at least partially housed in a space defined by a wall portion, the wall portion being configured to surround a periphery of an inner side surface of the specific portion facing the wavelength selective heat radiating member.

7. The battery pack according to claim 6, further comprising a wall portion configured to inhibit air near a periphery of the wavelength selective heat radiating member from moving.

8. The battery pack according to claim 6, wherein the housing includes a recess facing the wavelength selective heat radiating member at the specific portion, the recess being configured to inhibit air between the specific portion and the wavelength selective heat radiating member from moving, and wherein a thickness of the recess is smaller than a thickness of the periphery of the specific portion in the housing.

9. The battery pack according to claim 6, wherein the housing includes an attachment portion for attachment to the electric working machine, and an outer side surface of the specific portion of the housing is a non-attachment portion of an outer side surface of the housing.

10. The battery pack according to claim 6, wherein the electronic component includes an electronic component associated with a power supply.

11. The battery pack according to claim 6, wherein the electronic component includes a switching element configured to connect and disconnect a charge and/or discharge path.

12. An electric working machine comprising:
an electronic component;
a metal plate thermally coupled to the electronic component,
a housing configured to house the electronic component and the metal plate; and
a wavelength selective heat radiating member mounted on a surface of the metal plate so as to face an inner side surface of a specific portion of the housing, the wavelength selective heat radiating member including a plurality of micro-cavities and being configured to convert, by the plurality of micro-cavities, thermal energy from the electronic and configured into heat radiation having a wavelength in an infrared wavelength range that penetrates the specific portion of the housing, and to emit the heat radiation toward the inner side surface of the specific portion of the housing,
wherein the housing includes a recess facing the wavelength selective heat radiating member at the specific portion, the recess being configured to inhibit air between the specific portion and the wavelength selective heat radiating member from moving, and
wherein a thickness of the recess is smaller than a thickness of a periphery of the specific portion in the housing.

13. The electric working machine according to claim 12, further comprising a wall portion configured to surround the periphery of an inner side surface of the specific portion facing the wavelength selective heat radiating member, wherein a thickness of the specific portion of the housing is smaller than a thickness of a periphery of the specific portion of the housing wherein the wavelength selective heat radiating member is at least partially housed in a space defined by the wall portion.

14. The electric working machine according to claim 12, further comprising:
a wall portion configured to inhibit air near a periphery of the wavelength selective heat radiating member from moving.

15. The electric working machine according to claim 12, wherein the housing includes a portion where a battery pack is attached,
wherein the electric working machine is configured to receive electric power from the battery pack, and
wherein an outer side surface of the specific portion of the housing is a portion of an outer side surface of the housing different from the portion where the battery pack is attached.

16. The electric working machine according to claim 12, further comprising a motor,
wherein the electronic component includes an electronic component associated with driving of the motor.

17. The electric working machine according to claim 16, wherein the electronic component includes an inverter.

\* \* \* \* \*

UNITED STATES PATENT AND TRADEMARK OFFICE
CERTIFICATE OF CORRECTION

PATENT NO. : 10,673,106 B2
APPLICATION NO. : 15/724660
DATED : June 2, 2020
INVENTOR(S) : Hitoshi Suzuki et al.

Page 1 of 1

It is certified that error appears in the above-identified patent and that said Letters Patent is hereby corrected as shown below:

In the Claims

At Column 12, Line number 29, Claim number 12:
Delete "and configured" and insert -- component --, therefor.

Signed and Sealed this
First Day of September, 2020

Andrei Iancu
*Director of the United States Patent and Trademark Office*